(12) United States Patent
Seppi et al.

(10) Patent No.: US 6,486,808 B1
(45) Date of Patent: Nov. 26, 2002

(54) DATA SIGNAL AMPLIFIER WITH AUTOMATICALLY CONTROLLABLE DYNAMIC SIGNAL RANGE

(75) Inventors: Edward Seppi, Portola Valley, CA (US); Edward Shapiro, Menlo Park, CA (US); George Zentai, San Jose, CA (US); Richard Colbeth, Los Altos, CA (US)

(73) Assignee: Varian Medical Systems, Mountain View, CA (US)

( * ) Notice: Subject to any disclaimer, the term of this patent is extended or adjusted under 35 U.S.C. 154(b) by 0 days.

(21) Appl. No.: 09/978,727

(22) Filed: Oct. 16, 2001

(51) Int. Cl.[7] .................................................. H03M 1/84
(52) U.S. Cl. ....................................... 341/139; 330/302
(58) Field of Search ......................... 341/139; 330/302, 330/306

(56) References Cited

U.S. PATENT DOCUMENTS

| | | |
|---|---|---|
| 5,801,571 A | 9/1998 | Allen et al. |
| 5,872,470 A | 2/1999 | Mallinson et al. |
| 5,970,115 A | 10/1999 | Colbeth et al. |
| 6,084,461 A | 7/2000 | Colbeth et al. |
| 6,310,567 B1 * | 10/2001 | Copley et al. ............... 341/139 |

OTHER PUBLICATIONS

Martin Mallinson and Paul Spitalny, Analog Devices, 1992 IEEE International Solid–State Circuits Conference, Feb. 19, 1992, pp. 40–42, Paper WP 2,6.

* cited by examiner

Primary Examiner—Peguy JeanPierre
Assistant Examiner—Joseph J Lauture
(74) Attorney, Agent, or Firm—Wildman Harrold Allen & Dixon

(57) ABSTRACT

A preamplifier stage with dynamically controllable signal gain in a data signal processing circuit that includes a downstream analog-to-digital signal converter. The level of the data signal subsequent to its preamplification is monitored and the gain of the preamplifier stage is dynamically adjusted in response to such data signal transcending one or more predetermined thresholds. Hence, the effective dynamic range of the preamplifier stage is extended, thereby also effectively extending the dynamic range of the overall system beyond that to which it would have otherwise been limited by the dynamic range of the analog-to-digital signal converter. In accordance with a preferred embodiment of the invention, such a preamplifier is used in an X-ray imaging system such as that using flat panel solid state imaging devices.

16 Claims, 1 Drawing Sheet

DATA SIGNAL AMPLIFIER WITH AUTOMATICALLY CONTROLLABLE DYNAMIC SIGNAL RANGE

BACKGROUND OF THE INVENTION

1. Field of the Invention

The present invention relates to analog amplifiers for preamplifying low-level signals, and in particular, to analog preamplifier circuits having controllable dynamic signal ranges for amplifying charge-biased signals.

2. Description of the Related Art

High dynamic signal range is a key parameter for many types of circuits. This is particularly true in the area of flat panel X-ray imaging systems. As is well known in the art, such systems use a detector cassette containing a scintillation layer that absorbs and converts impinging X-ray photons to visible light photons for detection by photosensitive elements that are also within the detector array. As is further well known, such a detector array contains a two dimensional array of microscopic squares referred to as picture elements, or "pixels". Each pixel includes an addressable photosensitive element, such as a photodiode and switching transistor combination. From such circuitry individual pixel data signals, generally in the form of charge-based signals, are provided for amplification and further processing. Further discussion of this type of imaging system can be found in commonly assigned U.S. Pat. No. 5,970,115, entitled "Multiple Mode Digital X-Ray Imaging System", the disclosure of which is incorporated herein by reference.

As part of the processing of such data signals, following preamplification and some form of a sample and hold operation, such signals are converted to digital signals using an analog-to-digital conversion circuit (ADC). Generally it is this ADC circuitry that sets, or limits, the maximum dynamic range of the system, typically at 14 bits. Such a maximum dynamic range, however, in the field of flat panel X-ray imaging systems has been an impediment to the commercial success of such systems. Accordingly, it would be desirable to have a technique whereby the maximum dynamic range can be extended and thus, be more independent from the maximum range of the ADC circuitry.

SUMMARY OF THE INVENTION

In accordance with the presently claimed invention, a dynamically controllable dynamic signal range is provided in the preamplifier stage of a data signal processing circuit that includes a downstream analog-to-digital signal converter. By monitoring the level of the data signal subsequent to its preamplification, the gain of the preamplifier stage is dynamically adjusted, thereby extending the effective, or usable, dynamic range of the preamplifier stage. This provides the further advantage of effectively extending the dynamic range of the overall system beyond that to which it would have otherwise been limited by the dynamic range of the analog-to-digital signal converter. One particularly advantageous application for this invention is in an X-ray imaging system such as that using flat panel solid state imaging devices.

Data signal amplification and processing circuitry with a dynamically controllable dynamic signal range in accordance with one embodiment of the presently claimed invention includes input and output terminals, amplification and processing circuitry, and control circuitry. The input terminal is for conveying an input data signal having a data signal charge associated therewith. The output terminal is for conveying an output data signal corresponding to the input data signal. The amplification and processing circuitry, coupled between the input and output terminals and including preamplification circuitry with a variable feedback capacitance associated therewith, receives a gain control signal and the input data signal and generates the output data signal, wherein a ratio of the output and input data signals is a function of the data signal charge and feedback capacitance and is responsive to the gain control signal. The control circuitry, coupled between the output terminal and the amplification and processing circuitry, monitors the output data signal and controls the variable feedback capacitance via the gain control signal, wherein the variable feedback capacitance is changed when the output data signal transcends a predetermined signal threshold.

An X-ray imaging system in accordance with one embodiment of the presently claimed invention includes an X-ray imaging device, amplification and processing circuitry, and control circuitry. The X-ray imaging device provides a plurality of pixel data signals having respective data signal charges associated therewith. The amplification and processing circuitry, coupled to the X-ray imaging device and including preamplification circuitry with a plurality of variable feedback capacitances associated therewith, receives one or more gain control signals and the plurality of pixel data signals and generates a plurality of output data signals corresponding respectively to the plurality of pixel data signals, wherein respective ratios of respective ones of the pluralities of output and pixel data signals are functions of corresponding respective ones of the data signal charges and feedback capacitances and are responsive to respective ones of the one or more gain control signals. The control circuitry, coupled to the amplification and processing circuitry, monitors the plurality of output data signals and controls the plurality of variable feedback capacitances via the one or more gain control signals, wherein respective ones of the plurality of variable feedback capacitances are selectively changed when one or more of the plurality of output data signals transcend one or more predetermined signal thresholds.

DETAILED DESCRIPTION OF THE INVENTION

It should be noted that although the following discussion is in the context of an X-ray imaging system, a data signal amplifier with dynamically controllable signal gain in accordance with the presently claimed invention can be used advantageously in virtually any system requiring a way to extend the overall dynamic range of such system and to do so in a dynamic manner.

Figure 1:
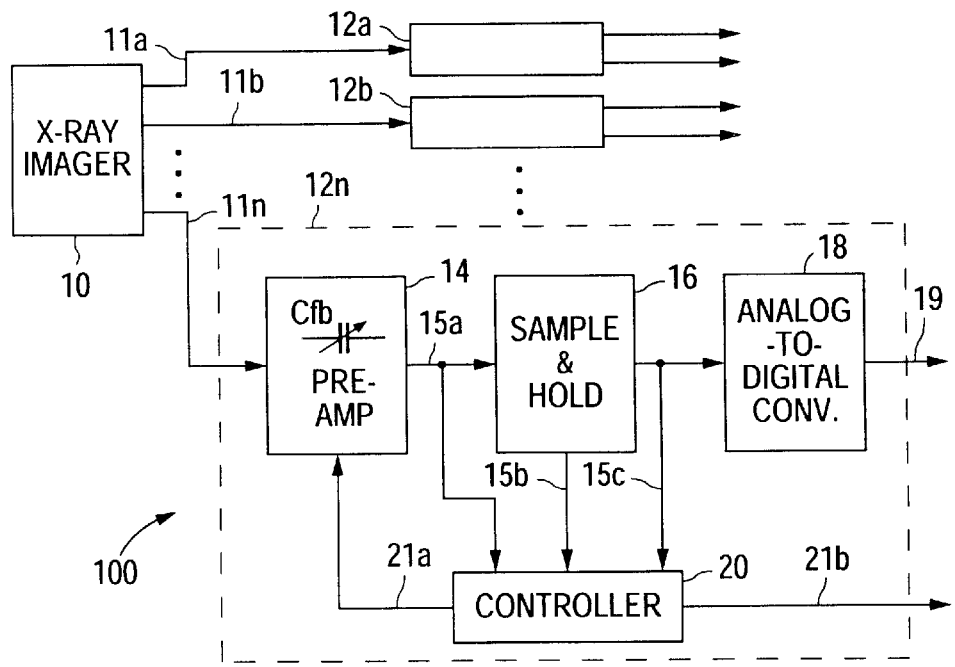
FIG. 1 is a functional block diagram of an X-ray imaging system using a data signal amplifier with dynamically controllable dynamic signal range in accordance with one embodiment of the present invention.

Referring to FIG. 1, an X-ray imaging system using a data signal amplifier with dynamically controllable dynamic signal range in accordance with one embodiment of the present invention includes an X-ray imager device 10 and a plurality of data signal amplification and processing stages 12 (12a, 12b, ..., 12n), interconnected substantially as shown. As is well known in the art (e.g., see U.S. Pat. No. 5,970,115), the X-ray imager device 10 provides multiple pixel data signals 11 (11a, 11b, ..., 11n), each of which is received by one of the data signal amplification and processing stages 12. As is also well known in the art, each of the pixel data signals 11 has associated therewith a data signal charge Qdata, which is the electrical charge corresponding to the pixel data and being provided at the input to the data signal amplification and processing stage 12 (discussed in more detail below).

The pixel data signal 11 is received and amplified by the preamplifier stage 14. This preamplifier stage 14 has a feedback capacitance Cfb associated with it (discussed in more detail below). Such feedback capacitance Cfb operates in conjunction with the data signal charge Qdata to establish the gain of the preamplifier stage 14. In other words, in accordance with well-known principals, the signal gain of the preamplifier stage 14 is a function of the data signal charge Qdata and feedback capacitance Cfb (Gain=Vdata/Qdata=1/Cfb, where Vdata is the output signal 15a voltage of the preamplifier stage 14). Also, as discussed in more detail below, in accordance with the present invention, this feedback capacitance Cfb is variable and is controlled by a gain control signal 21a provided by the controller stage 20.

The output 15a of the preamplifier stage 14 is processed by a sample and hold stage 16 which samples this signal 15a and holds it for the requisite time to allow a downstream analog-to-digital converter (ADC) 18 to convert such held signal to a digital equivalent signal 19.

The controller stage 20 monitors one or more output signals from the preamplifier stage 14 and sample and hold stage 16. Such signals can include, among others, the output 15a from the preamplifier stage 14, the output 15c from the sample and hold stage 16, and an interim signal 15b generated within the sample and hold stage 16. In a preferred embodiment of the present invention, the monitored signal is the signal 15a generated by the preamplifier stage 14. However, any of the other signals 15b, 15c may be monitored as well for purposes of this invention, since it is only necessary that the monitored signal bear some known relationship or correspondence to the original pixel data signal 11 in accordance with the gain of the preamplifier stage 14.

The controller 20 monitors this signal 15 so as to determine when such signal 15 transcends one or more predetermined signal thresholds (discussed in more detail below). When such a threshold crossing occurs, the controller 20, by way of the gain control signal 21a, adjusts the value of the feedback capacitance Cfb within the preamplifier stage 14. Accordingly, when the monitored signal 15 indicates that the feedback capacitance Cfb is approaching saturation, the controller 20 can adjust the gain control signal 21a to selectively increase the value of the feedback capacitance Cfb and thereby decrease the gain (=Vdata/Qdata=1/Cfb) while increasing the dynamic range (i.e., the maximum possible output signal voltage without device or circuit saturation). When this occurs, the controller 20 also generates a correction indication signal 21b to alert a downstream processing stage (not shown) that the digital equivalent data signal 19 is being provided in accordance with a new gain factor as determined by the data signal charge Qdata and the newly adjusted feedback capacitance Cfb.

Figure 2:
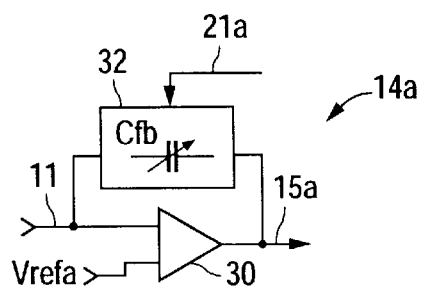
FIG. 2 is a functional block diagram of the preamplifier stage of FIG. 1.

Referring to FIG. 2, one embodiment 14a of the preamplifier stage 14 includes a differential amplifier 30 and a variable feedback capacitance stage 32, interconnected as shown. The incoming pixel data signal 11 is compared by the differential amplifier 30 to a reference signal Vrefa. The pixel data signal 11 is amplified by this amplifier 30 to produce the output signal 15a while rejecting common mode signal components that may appear in the pixel data 11 and reference Vrefa signals. The feedback capacitance Cfb is, as discussed above, adjusted as necessary by the gain control signal 21a from the controller stage 20.

Figure 3:
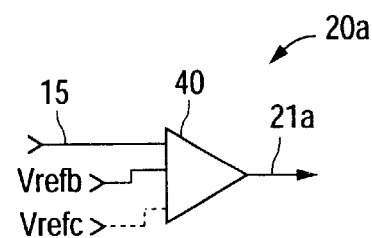
FIG. 3 is a functional block diagram of the controller stage of the circuit of FIG. 1.
Figure 3A:
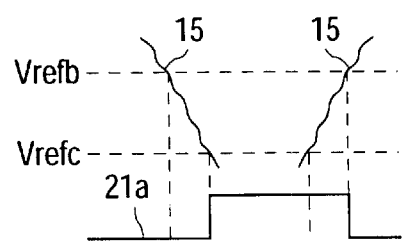
FIG. 3A is a graph of the hysteresis effect provided by the comparator circuit of FIG. 3.

Referring to FIG. 3, one embodiment 20a of the controller stage 20 includes a comparator circuit 40 which compares the monitored signal 15 to one or more external reference signals Vrefb, Vrefc, which may be adjusted for providing hysteresis as desired. As should be well understood, if no hysteresis is desired or needed, only one reference signal Vrefb may be required. Accordingly, as the monitored signal 15 crosses, or transcends, this reference signal Vrefb in either direction, the resulting gain control signal 21a will have one of two signal states. However, if hysteresis is required or desired, an additional reference signal Vrefc can be used so that the gain control signal 21a is adjusted only when the monitored signal 15 crosses the first reference signal Vrefb in one direction and crosses the second reference signal Vrefc in another direction. This hysteresis effect is depicted in the graph of FIG. 3A.

Figure 4:
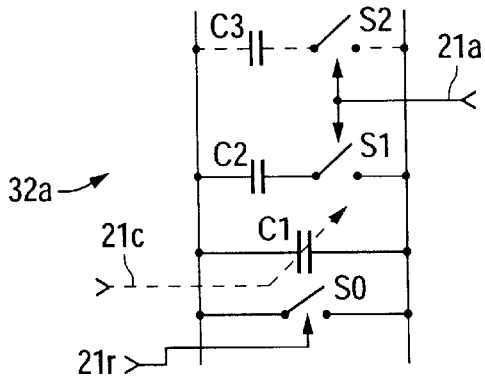
FIG. 4 is a schematic diagram of an exemplary implementation of the variable feedback capacitance depicted in the circuit of FIG. 2.

Referring to FIG. 4, one embodiment 32a of the feedback capacitance stage 32 in the circuit of FIG. 2 can be implemented substantially as shown. Capacitor C1 serves as the primary, or baseline, capacitance so as to provide a baseline gain value in conjunction with the data line capacitance Cdata, as discussed above. One or more additional capacitances C2, C3 can be included so as to provide a range of additional capacitance values. For example, if capacitor C2 is switched in to be included in parallel with capacitor C1, then the net feedback capacitance Cfb is the sum of capacitances C1 and C2. Similarly, if capacitance C3 were used instead of capacitance C2, then the net feedback capacitance is the sum of capacitances C1 and C3.

Capacitors C2 and C3 are selectively switched in or out of the circuit using solid-state switches S1 and S2, respectively. Such switches S1, S2 are controlled by the gain control signal 21a in accordance with well-known techniques. Further, such switches S1, S2 are generally designed as pass transistors or transmission gates (dual pass transistors connected in parallel) in accordance with well-known circuit design techniques.

Additionally, it is possible to implement the baseline capacitor C1 as one which is fabricated in accordance with well-known techniques to be a variable capacitance (e.g., varactor) controlled by an additional gain control signal 21c. Generally, a reset switch S0 is also provided, controlled by a reset signal 21r, so as to reset this circuit by discharging all capacitances at the appropriate time.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including data signal amplification and processing circuitry with a dynamically controllable dynamic signal range, comprising:

an input terminal for conveying an input data signal having a data signal charge associated therewith;

an output terminal for conveying an output data signal corresponding to said input data signal;

amplification and processing circuitry, coupled between said input and output terminals and including preamplification circuitry with a variable feedback capacitance associated therewith, that receives a gain control signal and said input data signal and generates said output data signal, wherein a ratio of said output and input data signals is a function of said data signal charge and feedback capacitance and is responsive to said gain control signal; and control circuitry, coupled between said output terminal and said amplification and processing circuitry, that monitors said output data signal and controls said variable feedback capacitance via said gain control signal, wherein said variable feedback capacitance is changed when said output data signal transcends a predetermined signal threshold.

2. The apparatus of claim 1, wherein said amplification and processing circuitry comprises a differential amplifier having input and output terminals with said variable feedback capacitance coupled between said amplifier input and output terminals.

3. The apparatus of claim 2, wherein said amplification and processing circuitry further comprises sample-and-hold circuitry, coupled to said differential amplifier, that samples said output data signal.

4. The apparatus of claim 1, wherein said variable feedback capacitance comprises a plurality of switched capacitor circuits coupled in parallel.

5. The apparatus of claim 1, wherein said variable feedback capacitance comprises a variable capacitor coupled in parallel with one or more switched capacitor circuits.

6. The apparatus of claim 1, wherein said control circuitry comprises a comparator circuit that compares said output data signal to a reference signal.

7. The apparatus of claim 1, further comprising analog-to-digital conversion circuitry, coupled to said output terminal, that converts said output data signal to a digital data signal.

8. An apparatus including data signal amplification and processing circuitry with a dynamically controllable dynamic signal range, comprising:

input means for conveying an input data signal having a data signal charge associated therewith;

output means for conveying an output data signal corresponding to said input data signal;

amplifier and processor means, including preamplifier means with a variable feedback capacitance associated therewith, for receiving a gain control signal and said input data signal and generating said output data signal, wherein a ratio of said output and input data signals is a function of said data signal charge and feedback capacitance and is responsive to said gain control signal; and controller means for monitoring said output data signal and controlling said variable feedback capacitance via said gain control signal, wherein said variable feedback capacitance is changed when said output data signal transcends a predetermined signal threshold.

9. An apparatus including an X-ray imaging system, comprising:

an X-ray imaging device that provides a plurality of pixel data signals having respective data signal charges associated therewith;

amplification and processing circuitry, coupled to said X-ray imaging device and including preamplification circuitry with a plurality of variable feedback capacitances associated therewith, that receives one or more gain control signals and said plurality of pixel data signals and generates a plurality of output data signals corresponding respectively to said plurality of pixel data signals, wherein respective ratios of respective ones of said pluralities of output and pixel data signals are functions of corresponding respective ones of said data signal charges and feedback capacitances and are responsive to respective ones of said one or more gain control signals; and control circuitry, coupled to said amplification and processing circuitry, that monitors said plurality of output data signals and controls said plurality of variable feedback capacitances via said one or more gain control signals, wherein respective ones of said plurality of variable feedback capacitances are selectively changed when one or more of said plurality of output data signals transcend one or more predetermined signal thresholds.

10. The apparatus of claim 9, wherein said amplification and processing circuitry comprises a plurality of differential amplifiers having respective input and output terminals with respective ones of said plurality of variable feedback capacitances coupled between said respective amplifier input and output terminals.

11. The apparatus of claim 10, wherein said amplification and processing circuitry further comprises sample-and-hold circuitry, coupled to said plurality of differential amplifiers, that samples said plurality of output data signals.

12. The apparatus of claim 9, wherein each one of said plurality of variable feedback capacitances comprises a plurality of switched capacitor circuits coupled in parallel.

13. The apparatus of claim 9, wherein each one of said plurality of variable feedback capacitances comprises a variable capacitor coupled in parallel with one or more switched capacitor circuits.

14. The apparatus of claim 9, wherein said control circuitry comprises a plurality of comparator circuits that compare respective ones of said plurality of output data signals to one or more respective reference signals.

15. The apparatus of claim 9, further comprising analog-to-digital conversion circuitry, coupled to said amplification and processing circuitry, that converts said plurality of output data signals to a plurality of digital data signals.

16. An apparatus including an X-ray imaging system, comprising:

X-ray imaging means for providing a plurality of pixel data signals having respective data signal charges associated therewith;

amplifier and processor means, including preamplifier means with a plurality of variable feedback capacitances associated therewith, for receiving one or more gain control signals and said plurality of pixel data signals and generating a plurality of output data signals corresponding respectively to said plurality of pixel data signals, wherein respective ratios of respective ones of said pluralities of output and pixel data signals are functions of corresponding respective ones of said data signal charges and feedback capacitances and are responsive to respective ones of said one or more gain control signals; and controller means for monitoring said plurality of output data signals and controlling said plurality of variable feedback capacitances via said one or more gain control signals, wherein respective ones of said plurality of variable feedback capacitances are selectively changed when one or more of said plurality of output data signals transcend one or more predetermined signal thresholds.

* * * * *